(12) United States Patent
Lafort et al.

(10) Patent No.: US 10,243,521 B2
(45) Date of Patent: Mar. 26, 2019

(54) CIRCUIT FOR PROVIDING A HIGH AND A LOW IMPEDANCE AND A SYSTEM COMPRISING THE CIRCUIT

(71) Applicant: Sonion Nederland B.V., Hoofddorp (NL)

(72) Inventors: Adrianus Maria Lafort, Hoofddorp (NL); Michiel van Nieuwkerk, Hoofddorp (NL)

(73) Assignee: Sonion Nederland B.V., Hoofddorp (NL)

( * ) Notice: Subject to any disclaimer, the term of this patent is extended or adjusted under 35 U.S.C. 154(b) by 27 days.

(21) Appl. No.: 15/816,078

(22) Filed: Nov. 17, 2017

(65) Prior Publication Data

US 2018/0146301 A1 May 24, 2018

(30) Foreign Application Priority Data

Nov. 18, 2016 (EP) ..................................... 16199644

(51) Int. Cl.
*H04R 3/00* (2006.01)
*H03F 1/54* (2006.01)
(Continued)

(52) U.S. Cl.
CPC ............. *H03F 1/548* (2013.01); *H03F 1/523* (2013.01); *H03F 1/56* (2013.01); *H03F 3/10* (2013.01);
(Continued)

(58) Field of Classification Search
CPC .. H04R 19/005; H04R 19/04; H04R 2430/01; H04R 27/00; H04R 3/12; H04R 29/007;
(Continued)

(56) References Cited

U.S. PATENT DOCUMENTS 6,788,796 B1  9/2004  Miles
6,831,577 B1  12/2004  Furst
(Continued)

FOREIGN PATENT DOCUMENTS

EP  1553696 A1  7/2005
EP  2648333 A3  10/2013
(Continued)

OTHER PUBLICATIONS

Extended European Search Report in European Patent Application No. EP 16199651, dated Mar. 31, 2017 (3 pages).
(Continued)

*Primary Examiner* — Lun-See Lao
(74) *Attorney, Agent, or Firm* — Nixon Peabody LLP

(57) ABSTRACT

A system including a transducer and an amplifier as well as a circuit which always has a high impedance at low voltages. In addition, at high voltages, the circuit has a high impedance at high frequencies but a low impedance at low frequencies. In biased transducers, this circuit may be used between the charge pump and the transducer. In general, the circuit may be provided in a signal path between the transducer and the amplifier. The circuit has as an advantage that at startup, low frequency signals at high intensities may overload the amplifier, whereas at operation, higher frequency signals are desired fed to the amplifier at the same intensity. This is facilitated by the circuit.

15 Claims, 7 Drawing Sheets

(51) Int. Cl.
  *H03F 3/10* (2006.01)
  *H03F 3/187* (2006.01)
  *H03H 11/28* (2006.01)
  *H04R 19/00* (2006.01)
  *H04R 19/04* (2006.01)
  *H03F 1/52* (2006.01)
  *H03F 1/56* (2006.01)
  *H03F 3/195* (2006.01)

(52) U.S. Cl.
  CPC ............. *H03F 3/187* (2013.01); *H03F 3/195* (2013.01); *H03H 11/28* (2013.01); *H04R 3/00* (2013.01); *H04R 19/005* (2013.01); *H04R 19/04* (2013.01); *H03F 2200/03* (2013.01); *H03F 2200/222* (2013.01); *H03F 2200/426* (2013.01); *H03F 2200/444* (2013.01); *H03F 2200/451* (2013.01); *H04R 2201/003* (2013.01)

(58) Field of Classification Search
  CPC ........ H04R 2227/003; H04R 2227/005; H04R 29/001; H04R 1/026; H04R 2227/001; H04R 2227/007; H04R 2420/09; H04R 29/002; H04R 3/005; H04R 3/007; H03B 2200/0062; H03B 5/24; H04S 7/308; H04S 7/301; H04S 7/307
  USPC .......... 381/111–114, 174, 122, 120, 91, 355, 381/356, 1
  See application file for complete search history.

(56) References Cited

U.S. PATENT DOCUMENTS

| | | | | |
|---|---|---|---|---|
| 6,853,290 | B2 | 2/2005 | Jorgensen | |
| 6,859,542 | B2 | 2/2005 | Johannsen | |
| 6,888,408 | B2 | 5/2005 | Furst | |
| 6,914,992 | B1 | 7/2005 | van Halteren | |
| 6,919,519 | B2 | 7/2005 | Ravnkilde | |
| 6,930,259 | B1 | 8/2005 | Jorgensen | |
| 6,943,308 | B2 | 9/2005 | Ravnkilde | |
| 6,974,921 | B2 | 12/2005 | Jorgensen | |
| 7,008,271 | B2 | 3/2006 | Jorgensen | |
| 7,012,200 | B2 | 3/2006 | Moller | |
| 7,062,058 | B2 | 6/2006 | Steeman | |
| 7,062,063 | B2 | 6/2006 | Hansen | |
| 7,072,482 | B2 | 7/2006 | Van Doorn | |
| 7,088,839 | B2 | 8/2006 | Geschiere | |
| 7,110,560 | B2 | 9/2006 | Stenberg | |
| 7,136,496 | B2 | 11/2006 | van Halteren | |
| 7,142,682 | B2 | 11/2006 | Mullenborn | |
| 7,149,317 | B2 * | 12/2006 | Lafort | H03F 1/301 381/122 |
| 7,181,035 | B2 | 2/2007 | van Halteren | |
| 7,190,803 | B2 | 3/2007 | van Halteren | |
| 7,206,428 | B2 | 4/2007 | Geschiere | |
| 7,221,766 | B2 | 5/2007 | Boor | |
| 7,221,767 | B2 | 5/2007 | Mullenborn | |
| 7,221,769 | B1 | 5/2007 | Jorgensen | |
| 7,227,968 | B2 | 6/2007 | van Halteren | |
| 7,239,714 | B2 | 7/2007 | de Blok | |
| 7,245,734 | B2 | 7/2007 | Niederdraenk | |
| 7,254,248 | B2 | 8/2007 | Johannsen | |
| 7,286,680 | B2 | 10/2007 | Steeman | |
| 7,292,700 | B1 | 11/2007 | Engbert | |
| 7,292,876 | B2 | 11/2007 | Bosh | |
| 7,336,794 | B2 | 2/2008 | Furst | |
| 7,376,240 | B2 | 5/2008 | Hansen | |
| 7,403,630 | B2 | 7/2008 | Jorgensen | |
| 7,415,121 | B2 | 8/2008 | Mögelin | |
| 7,425,196 | B2 | 9/2008 | Jorgensen | |
| 7,460,681 | B2 | 12/2008 | Geschiere | |
| 7,466,835 | B2 | 12/2008 | Stenberg | |
| 7,492,919 | B2 | 2/2009 | Engbert | |
| 7,548,626 | B2 | 6/2009 | Stenberg | |
| 7,657,048 | B2 | 2/2010 | van Halteren | |
| 7,684,575 | B2 | 3/2010 | van Halteren | |
| 7,706,561 | B2 | 4/2010 | Wilmink | |
| 7,715,583 | B2 | 5/2010 | Van Halteren | |
| 7,728,237 | B2 | 6/2010 | Pedersen | |
| 7,809,151 | B2 | 10/2010 | Van Halteren | |
| 7,822,218 | B2 | 10/2010 | Van Halteren | |
| 8,625,809 | B2 | 12/2010 | Josefsson | |
| 7,899,203 | B2 | 3/2011 | Van Halteren | |
| 7,912,240 | B2 | 3/2011 | Madaffari | |
| 7,946,890 | B1 | 5/2011 | Bondo | |
| 7,953,241 | B2 | 5/2011 | Jorgensen | |
| 7,961,899 | B2 | 6/2011 | Van Halteren | |
| 7,970,161 | B2 | 6/2011 | van Halteren | |
| 8,098,854 | B2 | 1/2012 | van Halteren | |
| 8,101,876 | B2 | 1/2012 | Andreasen | |
| 8,103,039 | B2 | 1/2012 | van Halteren | |
| 8,160,290 | B2 | 4/2012 | Jorgensen | |
| 8,170,237 | B2 | 5/2012 | Shajaan | |
| 8,170,249 | B2 | 5/2012 | Halteren | |
| 8,189,804 | B2 | 5/2012 | Hruza | |
| 8,189,820 | B2 | 5/2012 | Wang | |
| 8,223,981 | B2 | 7/2012 | Haila | |
| 8,223,996 | B2 | 7/2012 | Beekman | |
| 8,233,652 | B2 | 7/2012 | Jorgensen | |
| 8,259,963 | B2 | 9/2012 | Stenberg | |
| 8,259,976 | B2 | 9/2012 | van Halteren | |
| 8,259,977 | B2 | 9/2012 | Jorgensen | |
| 8,280,082 | B2 | 10/2012 | van Halteren | |
| 8,284,966 | B2 | 10/2012 | Wilk | |
| 8,313,336 | B2 | 11/2012 | Bondo | |
| 8,315,422 | B2 | 11/2012 | van Halteren | |
| 8,331,595 | B2 | 12/2012 | van Halteren | |
| 8,369,552 | B2 | 2/2013 | Engbert | |
| 8,379,899 | B2 | 2/2013 | van Halteren | |
| 8,509,468 | B2 | 8/2013 | van Halteren | |
| 8,526,651 | B2 | 9/2013 | Lafort | |
| 8,526,652 | B2 | 9/2013 | Ambrose | |
| 8,630,429 | B2 | 1/2014 | Daley | |
| 8,873,773 | B2 * | 10/2014 | Akino | H04R 29/006 381/111 |
| 9,148,729 | B2 | 9/2015 | Josefsson | |
| 9,197,967 | B2 * | 11/2015 | Mortensen | H04R 19/005 |
| 9,300,259 | B2 * | 3/2016 | Frohlich | H03F 1/34 |
| 9,716,945 | B2 | 7/2017 | Lesso | |
| 9,781,518 | B2 | 10/2017 | Schober | |
| 2002/0125949 | A1 | 9/2002 | Stenberg | |
| 2004/0179703 | A1 | 9/2004 | Boor | |
| 2007/0160234 | A1 | 7/2007 | Deruginsky | |
| 2008/0025531 | A1 | 1/2008 | Suzuki | |
| 2008/0205668 | A1 | 8/2008 | Torii | |
| 2009/0003629 | A1 | 1/2009 | Shajaan | |
| 2010/0166228 | A1 | 7/2010 | Steele | |
| 2010/0246859 | A1 | 9/2010 | Filippo | |
| 2010/0329487 | A1 | 12/2010 | David | |
| 2011/0182453 | A1 | 7/2011 | van Hal | |
| 2011/0189880 | A1 | 8/2011 | Bondo | |
| 2011/0299708 | A1 | 12/2011 | Bondo | |
| 2011/0299712 | A1 | 12/2011 | Bondo | |
| 2011/0311069 | A1 | 12/2011 | Ambrose | |
| 2012/0014548 | A1 | 1/2012 | van Halteren | |
| 2012/0027245 | A1 | 2/2012 | van Halteren | |
| 2012/0140966 | A1 | 6/2012 | Mocking | |
| 2012/0155683 | A1 | 6/2012 | van Halteren | |
| 2012/0155694 | A1 | 6/2012 | Reeuwijk | |
| 2012/0206205 | A1 * | 8/2012 | Hoogzaad | H03F 1/22 330/284 |
| 2012/0255805 | A1 | 10/2012 | van Halteren | |
| 2012/0269367 | A1 | 10/2012 | Akino | |
| 2013/0028451 | A1 | 1/2013 | de Roo | |
| 2013/0051582 | A1 | 2/2013 | Kropfitsch | |
| 2013/0129117 | A1 | 5/2013 | Thomsen | |
| 2013/0136284 | A1 | 5/2013 | van Hal | |
| 2013/0142370 | A1 | 6/2013 | Engbert | |
| 2013/0163799 | A1 | 6/2013 | Van Halteren | |
| 2013/0195291 | A1 | 8/2013 | Josefsson | |
| 2013/0195295 | A1 | 8/2013 | van Halteren | |
| 2014/0003609 | A1 | 1/2014 | Rombach | |
| 2014/0037121 | A1 | 2/2014 | Mortensen | |

(56) References Cited

U.S. PATENT DOCUMENTS

| | | | |
|---|---|---|---|
| 2014/0086433 A1* | 3/2014 | Josefsson | H04R 3/06 |
| | | | 381/98 |
| 2014/0264652 A1 | 9/2014 | Cagdaser | |
| 2015/0023529 A1* | 1/2015 | Barzen | G01R 27/2605 |
| | | | 381/174 |
| 2015/0137834 A1 | 5/2015 | Steiner | |
| 2015/0181352 A1 | 6/2015 | Astgimath | |
| 2015/0245143 A1 | 8/2015 | Akino | |
| 2016/0337753 A1* | 11/2016 | Akino | H04R 19/04 |
| 2016/0352294 A1 | 12/2016 | Nicollini | |
| 2017/0180858 A1 | 6/2017 | Kidambi | |
| 2017/0195788 A1 | 7/2017 | Nicollini | |
| 2017/0223450 A1 | 8/2017 | Alvarez | |
| 2018/0014123 A1 | 1/2018 | Shajaan | |
| 2018/0027338 A1 | 1/2018 | Shajaan | |
| 2018/0143068 A1* | 5/2018 | Lafort | G01H 11/06 |

FOREIGN PATENT DOCUMENTS

| | | |
|---|---|---|
| EP | 2978241 A1 | 1/2016 |
| EP | 1906704 A1 | 4/2018 |
| JP | 2006-295357 A | 10/2006 |
| WO | WO 01/78446 A1 | 10/2001 |
| WO | WO 2013/167183 A1 | 11/2003 |
| WO | WO 2012/148077 A3 | 11/2012 |

OTHER PUBLICATIONS

Extended European Search Report in European Patent Application No. EP 16199657, dated Apr. 11, 2017 (3 pages).
Extended European Search Report in European Patent Application No. EP 16199644, dated May 10, 2017 (3 pages).
Extended European Search Report in European Patent Application No. EP 16199653, dated May 11, 2017 (3 pages).
Pedersen M. et al., "High-Performance Condenser Microphone with Fully Integrated CMOS Amplifier and DC-DC Voltage Converter," Journal of Microelectromechanical Systems, vol. 7, No. 4, Dec. 1998, pp. 387-394 (8 pages).
Extended European Search Report in European Patent Application No. EP17202253, dated Mar. 15, 2018 (3 pages).
Extended European Search Report in European Patent Application No. EP 17202256, dated Mar. 21, 2018 (3 pages).
Extended European Search Report in European Patent Application No. EP 17202265, dated Apr. 10, 2018 (3 pages).

* cited by examiner

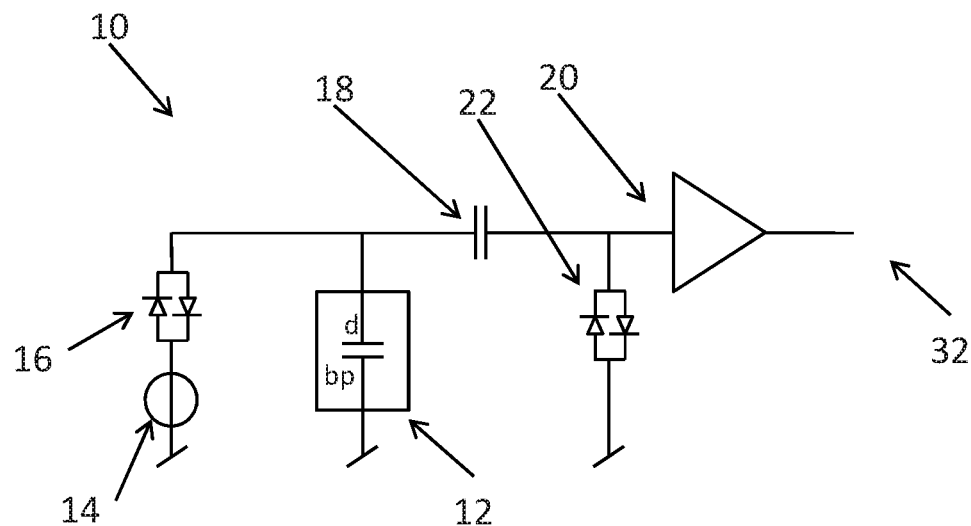
Figure 1; prior art
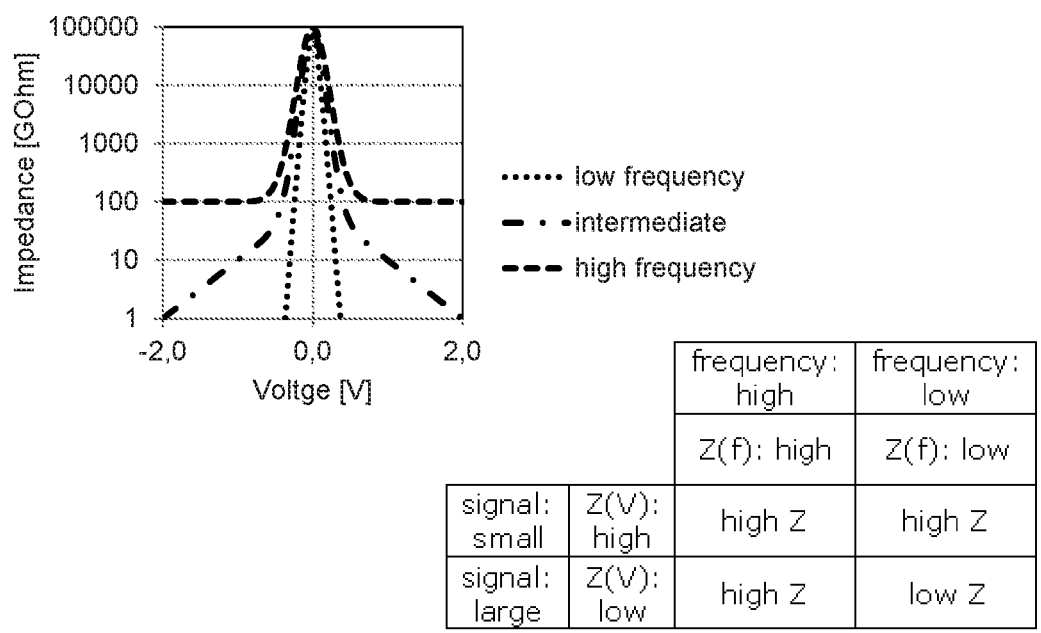
Figure 2

CIRCUIT FOR PROVIDING A HIGH AND A LOW IMPEDANCE AND A SYSTEM COMPRISING THE CIRCUIT

CROSS-REFERENCE TO RELATED APPLICATIONS

This application claims the benefit of European Patent Application Serial No. 16199644.2, filed Nov. 18, 2016, which is incorporated herein by reference in its entirety.

FIELD OF THE INVENTION

The present invention relates to a circuit for use in a system with a transducer and an amplifier, between which a high impedance is usually provided but where a low impedance is provided at high signal values and low frequencies.

BACKGROUND OF THE INVENTION

The transduction of a capacitive microphone is based on modulation of the electrical capacitance between a diaphragm and a backplate. With the capacitance biased by means of a constant charge, the voltage change due to the modulation can be read out by means of a buffer amplifier.

In MEMS capacitive microphones, the constant charge is approximated by connecting a DC bias voltage across the capacitor with a high impedance in series. In combination with the sensor capacitance, the high impedance forms a low-pass filter, so that for frequencies above the filter cut-off the constant charge condition is fulfilled.

A state-of-the-art implementation of the high impedance is a pair of antiparallel diodes, or a CMOS circuit (see e.g. U.S. Pat. No. 7,149,317 or U.S. Pat. No. 7,221,766). For small signals, the impedance of such pair can be very high. For large voltage swings however the impedance rapidly decreases to such low value that the MEMS capacitance is biased by a constant voltage instead of constant charge.

Apart from the fact that the transition from constant charge to constant voltage limits the output voltage swing of the MEMS, and thus the maximum sound pressure that can be handled without gross distortion, the constant voltage bias also causes the electrostatic pull-in at large diaphragm deflection.

The state-of-the-art solution for electrostatic pull-in is to integrate in the MEMS design some means that limit the mechanical deflection so that the electrostatic force in the constant voltage operation never exceeds the mechanical restoring force of the diaphragm. Depending of the mechanical design of the MEMS, there is a maximum stable bias voltage, which is well below the pull-in voltage, for stable constant voltage operation, which will form a practical limitation for the sensitivity of the microphone.

A solution for electrostatic pull-in is to ensure that under all conditions the MEMS will be biased in constant charge mode. If this can be fulfilled, there is no need for mechanical limitation of the diaphragm deflection, and the bias voltage can be increased to a level close to the pull-in voltage, thus allowing for higher microphone sensitivity.

A proposed solution (U.S. Pat. No. 8,630,429B2) employs a feedback network in order to control the behaviour of the high impedance. The disadvantage of this solution is that the dynamic range is still limited by the maximum voltage swing on the output of the feedback amplifier.

Other solutions may be seen in EP2648333, WO2012/148077, EP2978241, US2010/246859 and US2013/051582.

SUMMARY OF INVENTION

The present invention relates to another type of solution replacing the antiparallel diodes with a circuit with more suitable characteristics.

In a first aspect, the invention relates to a system comprising:
- a transducer with an output,
- an amplifier with an input,
- a transport element for receiving a signal from the transducer output and feeding a corresponding signal to the amplifier input and
- a circuit having a first and a second terminal and an impedance, between the first and second terminals which:
  - exceeds 100 GOhm when an absolute voltage below 0.2V is provided over the first and second terminals,
  - exceeds 100 GOhm when a signal with a frequency exceeding 50 Hz is provided over the first and second terminals and
  - is lower than 10 GOhm when a signal with an absolute voltage exceeding 0.4V and a frequency lower than 10 Hz is provided over the first and second terminals, wherein the first terminal is connected to the transport element and the second terminal is connected to a predetermined voltage.

In this context, the predetermined voltage may be a voltage around which the input to the amplifier is desired to vary, such as ground or a voltage centered between two supply voltages provided to the amplifier (such as ground and a supply voltage Vm, where the predetermined voltage may be Vm/2). Usually, the predetermined voltage is a constant and/or fixed voltage.

The transducer may be biased, such as when the system further comprises a first voltage supply configured to output a first voltage, and wherein the transducer comprises:
- one or more stationary elements,
- a movable element movable in relation to the stationary element(s) and
- a voltage input configured to receive the first voltage and provide the first voltage between two of the movable element and the stationary element(s)

the system further comprising an additional circuit having a first and a second terminal and an impedance, between the first and second terminals which:
- exceeds 100 GOhm when an absolute voltage below 0.2V is provided over the first and second terminals,
- exceeds 100 GOhm when a signal with a frequency exceeding 50 Hz is provided over the first and second terminals and
- is lower than 10 GOhm when a signal with an absolute voltage exceeding 0.4V and a frequency lower than 10 Hz is provided over the first and second terminals, the additional circuit having its first terminal connected to the voltage input and the second terminal to a second, predetermined voltage.

In this situation, the voltage swing at the voltage input may be a voltage around the first voltage. Then, when the below-described parallel circuits are used also for this purpose, the predetermined voltage and the other predetermined voltage may be provided on either side of such a voltage interval.

The second terminals of the two circuits may be connected to the same voltage if desired.

In this particular situation, the two circuits are each fed two voltages (the predetermined voltage and the other predetermined voltage), but they may be different as one pair of voltages are around the first voltage.

Another aspect of the invention relates to a system comprising:
a first voltage supply configured to output a first voltage,
a transducer comprising:
one or more stationary elements,
a movable element movable in relation to the stationary element(s),
a voltage input configured to receive the first voltage and provide the first voltage between two of the movable element and the stationary element(s), and
a transducer output,
an amplifier with an input,
a transport element for receiving a signal from the transducer output and feeding a corresponding signal to the amplifier input and
a circuit having a first and a second terminal and an impedance, between the first and second terminals which:
exceeds 100 GOhm when an absolute voltage below 0.2V is provided over the first and second terminals,
exceeds 100 GOhm when a signal with a frequency exceeding 50 Hz is provided over the first and second terminals and
is lower than 10 GOhm when a signal with an absolute voltage exceeding 0.4V and a frequency lower than 10 Hz is provided over the first and second terminals,
wherein the first terminal is connected to the voltage input and the second terminal to a predetermined voltage.

Naturally, the different aspects and embodiments of the invention may be interchanged and combined if desired.

In this respect, low frequency high voltage problems caused by the first voltage supply may be alleviated using the circuit.

As mentioned above, if the parallel circuits are used, the two voltages may be provided on either side of the first voltage.

In one embodiment, the system further comprises a second circuit, with the same characteristics, having the first terminal connected to the transport element and the second terminal to a predetermined voltage.

In general, a transducer may be an element configured to sense or detect a parameter of the transducer or its surroundings, such as vibration or sound. Some types of transducers have a deformable element, such as a piezo element, the amount of deformation defining the output. Often, however, the transducer will have a stationary element and a movable element and will output a signal corresponding to a variation of a distance between the movable element and the stationary element. In this respect, corresponding often means that the frequency contents of the output signal, at least within a predetermined frequency interval, corresponds to that of the parameter detected.

Naturally, which element is stationary and which is movable will depend on in which coordinate system one views the system. In many situations, the movable element is more resilient and bendable, for example, than the stationary element, so that the stationary element is stationary in relation to a remainder, such as a housing, of the transducer. Naturally, multiple movable elements may be used in addition to or instead of a movable element and a stationary element. Also, multiple stationary elements may be used together with the one or more movable elements.

Any number of stationary elements may be provided. Often one or two stationary elements are provided in situations where the movable element is a plane element, where the stationary element(s) is/are also plane element(s) provided parallel to the movable element in a desired distance so that the movable element may move while being in a vicinity of the stationary element(s). Transducers of this type may be microphones, where the movable element may then be a diaphragm.

The transducer usually has at least two transducer terminals. The output signal is normally output as a difference in voltage between two terminals. Thus, the output may be seen as derived from one of the terminals, if the other is kept at a predetermined, fixed voltage, such as ground.

One type of transducer is a capacitive transducer which is an electro-acoustical or electro-mechanical transducer, the capacitance of which varies with the parameter sensed. An electrical field may be generated in the transducer by biasing two elements therein (providing a voltage between the elements) and/or by permanently charging an element. When that or another element moves within that field, an output signal may be derived which relates to the change in capacitance due to this movement.

The biasing voltage may be provided between two of the movable element and the stationary element(s). If a single stationary element is provided, the first voltage is provided between the stationary element and the movable element. If two stationary elements are provided, the voltage may be provided between the stationary elements or between one stationary element and the movable element. Naturally, different voltages may be provided to all of the stationary elements and the movable element.

Multiple movable elements may also be provided if desired, where any additional movable element may also receive a voltage or output a signal.

An output of the transducer may be derived from any one or more of the stationary element(s) and the movable element. Usually, the output of the transceiver will depend on the movement or position of the movable element in relation to the stationary element(s).

An amplifier is an element which is configured to receive an input signal and output an output signal where the intensity (voltage/current or the like) of the output signal has been amplified. In this respect, an amplification may be higher than 1, so that the intensity output is higher than that received, or lower than 1, whereby the intensity output is lower than that received. An amplification of 1 outputs the same intensity. This may be desired for other purposes, such as for altering the apparent impedance of a circuit receiving the output of the amplifier compared to the component feeding the signal to the amplifier. The amplification may also be negative, whereby the polarization of the signal output of the amplifier is the opposite of that received.

Naturally, an amplifier may have multiple inputs. Often, when a single input is described, any additional inputs may be provided with predetermined signals or voltages, such as ground.

Naturally, the signal output of the transducer may be fed directly to the amplifier input. However, in some situations, a signal filtering/adaptation is desired and/or other signal handling, between these components. In some situations, components may be provided for generating a desired impedance of the signal output of the transducer or the amplifier input. In those or other situations, a galvanic separation of the two is desired.

Thus, between the transducer output and the amplifier input, a transporting element is provided which may simply be a conductor or which may comprise components for altering the signal output of the transducer before inputting a signal to the amplifier. Preferably, any components of the transporting element are passive, i.e. require no separate power supply.

A terminal may be an electrical conductor of or connected to the circuit.

An impedance, in this situation electrical impedance, of a circuit may be real or imaginary. In the following, the real value of the impedance, quantified in the SI unit Ohm is used.

In the present context, the circuit, i.e. any of the above circuits, has an impedance of 100 GOhm (100 Giga Ohm or 100,000,000,000 Ohm) or more when an absolute voltage over the terminals is 0.2V or less. Naturally, for one circuit, multiple circuits or all circuits, this impedance may be higher, such as 200 GOhm, 300 GOhm, 500 GOhm, 1000 GOhm or more. The voltage may be 0.2V or less, such as 0.15V or less, such as 0.1V or less.

That the voltage is absolute means that the circuit has this property irrespective of whether the first terminal is provided with a voltage higher than the second terminal or vice versa.

Also, this high impedance is provided between the terminals when a signal is provided over the terminals, such as to one of the terminals and not to the other has a frequency of 50 Hz or more. This signal may be fed to one terminal while the other terminal is maintained at a predetermined voltage, such as a constant voltage. Often, the signal has a voltage varying with the frequency in question.

Naturally, for one circuit, multiple circuits or all circuits, this frequency may be higher, such as 60 Hz, 70 Hz, 80 Hz, 100 Hz, 250 Hz or more.

However, for one circuit, multiple circuits or all circuits, the impedance is 10 GOhm or lower, such as 8 GOhm or lower, such as 5 GOhm or lower, such as 1 GOhm or lower, such as 100 kOhm or lower, when the signal over the terminals has an absolute voltage of 0.4V or more, such as 0.5V or more, such as 0.7V or more, such as 1V or more, such as 3V or more, such as 5V or more, such as 7V or more, such as 10V or more, and when the frequency of the signal is 10 Hz or less, such as 8 Hz or less, such as 5 Hz or less, such as 2 Hz or less, such as 1 Hz or less.

In one embodiment, the circuit is formed by a first sub-circuit and a second sub-circuit connected in series between the first and second terminals, where:
  the first sub-circuit has an impedance:
  exceeding 100 GOhm when a signal with an absolute voltage exceeding 0.4V is provided over the first and second terminal,
  lower than 10 GOhm when a signal with an absolute voltage lower than 0.2V is provided over the first and second terminal,
  the second sub-circuit has an impedance:
  exceeding 100 GOhm when a signal with a frequency exceeding 50 Hz is provided over the first and second terminal,
  lower than 10 GOhm when a signal with a frequency lower than 10 Hz is provided over the first and second terminal.

In that or another embodiment, which is described further below, the "main" circuit may comprise two parallel sub-circuits provided between (such as connected to) the terminals and which has the above properties not for an absolute voltage but each for a positive and a negative voltage, respectively. In fact, preferably, each parallel circuit has the above property when the voltage across the terminals is e.g. positive but has an impedance of 100 GOhm or higher when the voltage is in the other direction, so that the other circuit may reduce the overall impedance if the frequency is low and the voltage high.

In one embodiment, the first sub-circuit comprises a diode. An alternative embodiment, which is less desired in ICs, is a resistor with very high value. Other embodiments comprise providing the same functionality using e.g. one or more transistors.

In one embodiment, the second sub-circuit comprises:
  a third terminal and a fourth terminal,
  a first transistor having a base, a collector and an emitter and having its base connected to the third terminal and its collector connected to a predetermined voltage,
  a second transistor having a base, a collector and an emitter and having its collector connected to the third terminal and its emitter connected to the fourth terminal,
  a resistor connected between the emitter of the first transistor and the base of the second transistor,
  a third transistor having a base, a collector and an emitter and having its base connected to the base of the second transistor, its collector connected to the emitter of the first transistor and its emitter connected to the fourth terminal, and
  a capacitor connected between the base of the second transistor and the fourth terminal.

The third terminal may be a conductor connecting the circuit to the first circuit or it may form the first terminal of the overall circuit. The fourth terminal may form the second terminal of the overall circuit or may be connected to further components, such as the first circuit, connected to the second terminal.

The fourth terminal may be connected to another predetermined voltage. The operation of the circuit may be to bias the voltage at the third terminal and thus e.g. an input of the amplifier if used in the above system, toward this other predetermined voltage which may e.g. be ground/0V or e.g. a voltage being a mean value of two voltages supplied to the amplifier.

In this context, the predetermined voltage may be a voltage exceeding or being lower than any voltage supplied to the amplifier or received on the first terminal of the circuit.

In another embodiment, the second sub-circuit comprises:
  a third terminal and a fourth terminal,
  a first transistor having a gate, a source and a drain and having its gate connected to the third terminal and its drain connected to a predetermined voltage,
  a second transistor having a gate, a source and a drain and having its drain connected to the third terminal and its source connected to the fourth terminal,
  a resistor connected between the source of the first transistor and the gate of the second transistor,
  a third transistor having a gate, a source and a drain and having its gate connected to the gate of the second transistor, the drain to the source of the first transistor and its source connected to the fourth terminal, and
  a capacitor connected between the gate of the second transistor and the fourth terminal.

Naturally, in the two above embodiments, the types of transistors may be partly interchanged so that the circuit has a mix of bipolar transistors and FETs.

Also, the second sub-circuit may comprise another circuit with the same components connected in the same manner, and coupled in parallel to the original, second sub-circuit, but where the transistors of one of the parallel circuits is of the n-channel type and those of the other of the parallel circuits of the p-channel type.

Thus, in one embodiment, the second sub-circuit further comprises, connected between the third and fourth terminals:
- another first transistor having a base, a collector and an emitter and having its base connected to the third terminal and its collector connected to another predetermined voltage,
- another second transistor having a base, a collector and an emitter and having its collector connected to the third terminal and its emitter connected to the fourth terminal,
- another resistor connected between the emitter of the other first transistor and the base of the other second transistor,
- another third transistor having a base, a collector and an emitter and having its base connected to the base of the other second transistor, its collector connected to the emitter of the other first transistor and its emitter connected to the fourth terminal, and
- another capacitor connected between the base of the other second transistor and the fourth terminal where the first, second and third transistors are one of n-type and p-type transistors and wherein the other first, second and third transistors are the other of the n-type and p-type transistors.

Thus, the first, second and third transistors are those of one of the parallel sub-circuits and the other first, second and third transistors are those of the other of the parallel sub-circuits.

In one embodiment, as the transistor types may be interchanged, the second sub-circuit further comprises, connected between the third and fourth terminals:
- another first transistor having a gate, a source and a drain and having its gate connected to the third terminal and its drain connected to another predetermined voltage,
- another second transistor having a gate, a source and a drain and having its drain connected to the third terminal and its source connected to the fourth terminal,
- another resistor connected between the source of the other first transistor and the gate of the other second transistor,
- another third transistor having a gate, a source and a drain and having its gate connected to the gate of the other second transistor, the drain to the source of the other first transistor and its source connected to the fourth terminal, and
- another capacitor connected between the gate of the other second transistor and the fourth terminal, where the first, second and third transistors are one of n-type and p-type transistors and wherein the other first, second and third transistors are the other of the n-type and p-type transistors.

Thus, one of the second sub-circuits may operate to have the lower impedance only for a positive voltage over the first and second terminals and the other second sub-circuit only for a negative voltage over the first and second terminals.

As mentioned above, the series connection of the first and sub-second sub-circuits may be replaced by a parallel connection, such as when the "main" circuit has a third and a fourth sub-circuits connected in parallel between the first and second terminals, were the third sub-circuit has an impedance which:
- exceeds 100 GOhm when an positive voltage below 0.2V is provided to the first terminal compared to the second terminal,
- exceeds 100 GOhm when a signal with a frequency exceeding 50 Hz is provided over the first and second terminals,
- exceeds 100 GOhm when a signal with a frequency lower than 10 Hz is provided over the terminals, the signal having a negative voltage exceeding 0.4V provided to the first terminal compared to the second terminal and
- is lower than 10 GOhm when a signal with a frequency lower than 10 Hz is provided over the terminals, the signal having a positive voltage exceeding 0.4V provided to the first terminal compared to the second terminal and were the fourth sub-circuit has an impedance which:
- exceeds 100 GOhm when a negative voltage below 0.2V is provided to the first terminal compared to the second terminal,
- exceeds 100 GOhm when a signal with a frequency exceeding 50 Hz is provided over the first and second terminals,
- exceeds 100 GOhm when a signal with a frequency lower than 10 Hz is provided over the terminals, the signal having a positive voltage exceeding 0.4V provided to the first terminal compared to the second terminal and
- is lower than 10 GOhm when a signal with a frequency lower than 10 Hz is provided over the terminals, the signal having a negative voltage exceeding 0.4V provided to the first terminal compared to the second terminal.

Thus, the operation is split into two circuits of which one always has a high impedance while the other has the low impedance (when the frequency is low and the voltage high).

In one embodiment, one of the third and fourth sub-circuits comprises one of the sub-circuits described above:
- a third terminal and a fourth terminal,
- a first transistor having a base, a collector and an emitter and having its base connected to the third terminal and its collector connected to a predetermined voltage,
- a second transistor having a base, a collector and an emitter and having its collector connected to the third terminal and its emitter connected to the fourth terminal,
- a resistor connected between the emitter of the first transistor and the base of the second transistor,
- a third transistor having a base, a collector and an emitter and having its base connected to the base of the second transistor, its collector connected to the emitter of the first transistor and its emitter connected to the fourth terminal, and
- a capacitor connected between the base of the second transistor and the fourth terminal.

or one of the third and fourth sub-circuits comprises one of the sub-circuits described above:
- a third terminal and a fourth terminal,
- a first transistor having a gate, a source and a drain and having its gate connected to the third terminal and its drain connected to a predetermined voltage,
- a second transistor having a gate, a source and a drain and having its drain connected to the third terminal and its source connected to the fourth terminal,
- a resistor connected between the source of the first transistor and the gate of the second transistor,
- a third transistor having a gate, a source and a drain and having its gate connected to the gate of the second transistor, the drain to the source of the first transistor and its source connected to the fourth terminal, and
- a capacitor connected between the gate of the second transistor and the fourth terminal.

Circuits of these types have the above behaviour and are easily implemented.

A circuit of that type may be implemented together with a parallel circuit being of the same structure but where the transistors of one of the parallel (third and fourth) sub-circuits has P-type transistors, the other one may have n-type transistors.

In this context, a p-type transistor is a PNP or p-channel transistor and the n-type transistor is a NPN or n-channel transistor.

Thus, in one embodiment, the other of the third and fourth sub-circuits further comprises, connected between the third and fourth terminals:
  another first transistor having a base, a collector and an emitter and having its base connected to the third terminal and its collector connected to another predetermined voltage,
  another second transistor having a base, a collector and an emitter and having its collector connected to the third terminal and its emitter connected to the fourth terminal,
  another resistor connected between the emitter of the other first transistor and the base of the other second transistor,
  another third transistor having a base, a collector and an emitter and having its base connected to the base of the other second transistor, its collector connected to the emitter of the other first transistor and its emitter connected to the fourth terminal, and
  another capacitor connected between the base of the other second transistor and the fourth terminal
where the first, second and third transistors are one of n-type and p-type transistors and wherein the other first, second and third transistors are the other of the n-type and p-type transistors.

In another embodiment, the other of the third and fourth sub-circuits comprises, connected between the third and fourth terminals:
  another first transistor having a gate, a source and a drain and having its gate connected to the third terminal and its drain connected to another predetermined voltage,
  another second transistor having a gate, a source and a drain and having its drain connected to the third terminal and its source connected to the fourth terminal,
  another resistor connected between the source of the other first transistor and the gate of the other second transistor,
  another third transistor having a gate, a source and a drain and having its gate connected to the gate of the other second transistor, the drain to the source of the other first transistor and its source connected to the fourth terminal, and
  another capacitor connected between the gate of the other second transistor and the fourth terminal,
where the first, second and third transistors are one of n-type and p-type transistors and wherein the other first, second and third transistors are the other of the n-type and p-type transistors.

In this situation, the predetermined voltage and the other predetermined voltage may be different and have between them the full voltage swing expected at the third terminal.

Often, the second terminal is connected to a voltage, such as ground, around which the voltage at the second terminal is desired to swing. The predetermined voltage and the other predetermined voltage thus may be provided on either side of this voltage to which the second terminal is connected.

In another embodiment, where the bias voltage is connected to the same terminal of the transducer from which the signal is taken, two high impedance circuits are required, one between the input of the amplifier and a reference voltage, the second between the signal terminal of the transducer and the bias voltage generator. The second high impedance circuit would require two supply voltages, one higher than the sum of the bias voltage and the maximum signal voltage amplitude, and the other lower the difference of the bias voltage and the maximum signal amplitude.

However a simplification can be made, where the second high impedance circuit requires no additional supply voltages, and the impedance of the circuit is increased by capacitive coupling to corresponding nodes in the first high impedance circuit. The first high impedance in this approach can be regarded as a "master" circuit, and the second as a "slave" circuit, and the coupling between these two assures that the "slave" follows the impedance of the "master", with the only difference that the "slave" is operating at a higher voltage level than the "master".

Naturally, this invention may be combined with further technologies, such as particular choices in power supply, feedback, phase adaptation and the like as is seen in the Applicants co-pending applications with the titles "A TRANSDUCER WITH A HIGH SENSITIVITY", claiming priority from EP16199651.7, "A SENSING CIRCUIT COMPRISING AN AMPLIFYING CIRCUIT AND THE AMPLIFYING CIRCUIT", claiming priority from EP16199653.3, "AN ASSEMBLY AND AN AMPLIFIER FOR USE IN THE ASSEMBLY", claiming priority from EP16199655.8 and "A PHASE CORRECTING SYSTEM AND A PHASE CORRECTABLE TRANSDUCER SYSTEM", claiming priority from EP16199657.4, all filed on even date. These applications are hereby incorporated herein by reference in their entireties.

BRIEF DESCRIPTION OF THE DRAWINGS

In the following, preferred embodiments will be described with reference to the drawing, wherein:
FIG. 1 illustrates a prior art system using anti parallel diodes,
FIG. 2 illustrates a desired characteristic of a high impedance system.

DETAILED DESCRIPTION OF THE INVENTION

Figure 3:
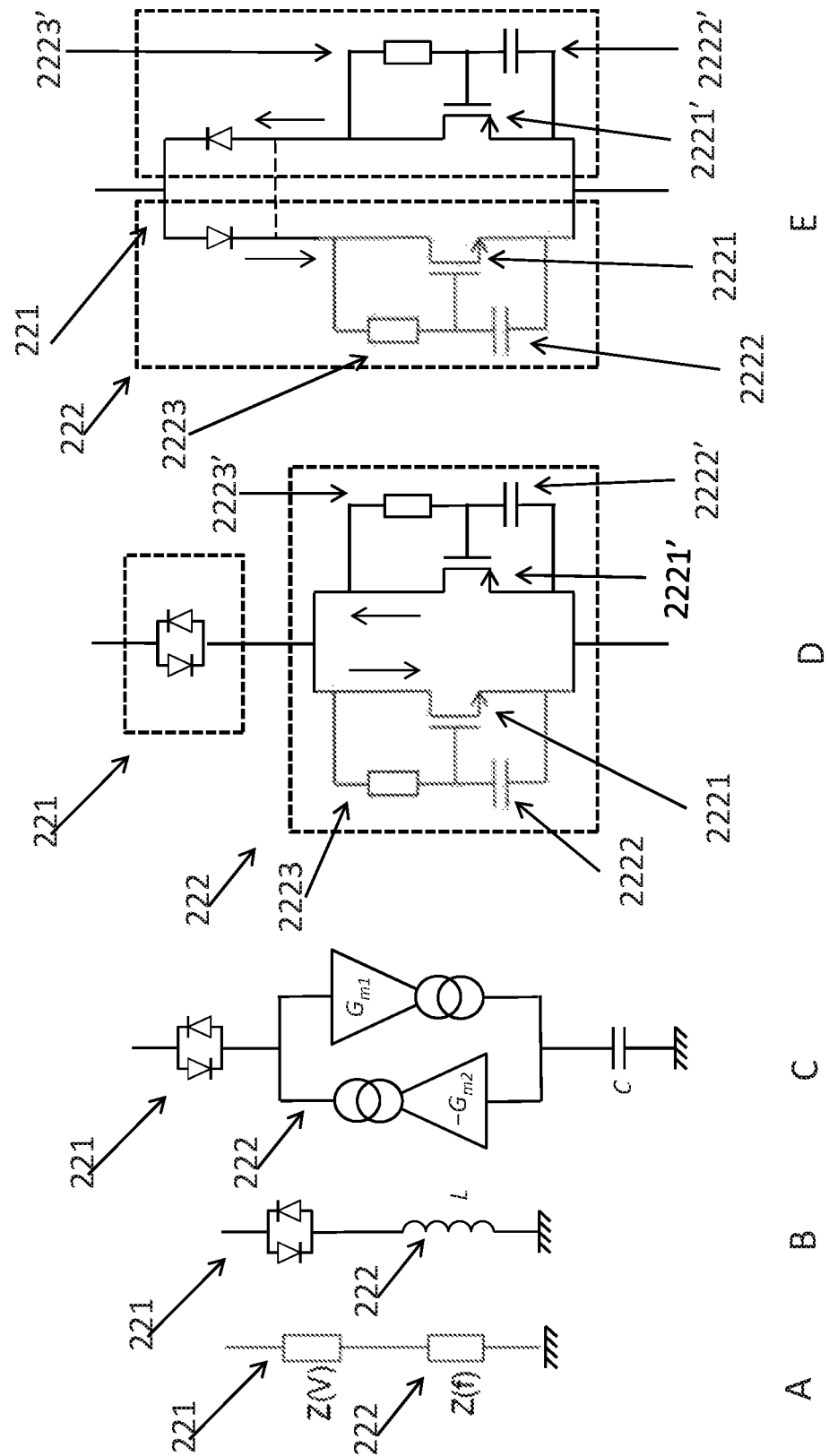
FIG. 3 illustrates a number of high impedance systems according to the invention.

In FIG. 1, the usual system is illustrated wherein a capacitive transducer 12 has two terminals, where an upper terminal is biased by a charge pump 14. The biasing voltage is supplied via a high impedance circuit, here in the form of a pair of anti parallel diodes 16. The upper terminal, which in this embodiment is connected to the diaphragm, d, which in this embodiment is connected to an input of an amplifier 20 via a DC decoupling capacitor 18 maintaining the constant charge mode of the transducer 12. The biasing voltage may be provided to any terminal of the transducer, and any terminal may be used for outputting the signal thereof.

The lower terminal of the transducer is connected to ground. Also provided is a second high impedance circuit 22, also in the form of a pair of anti parallel diodes, preventing the output of the transducer 12 from exceeding the forward voltage of the diodes.

Ideally, the element 22 to be used for biasing the input of the amplifier to a defined DC level has a very high impedance. The reasons for this are: 1) the impedance should not load the signal source and cause attenuation; 2) the noise current caused by the high impedance should be as low as possible, so that the noise contribution due to the biasing element is preferably lower or much lower than the noise contribution of the amplifier. There are different possible embodiments for such a high impedance; e.g. thick film resistors, thin film resistors or semiconductor circuits. Commercially available (low-cost) integrated circuit processes however usually don't comprise high resistive elements, so that in practice the choice is limited to semiconductor circuits. Examples of simple, passive, semiconductor circuits are anti-parallel diodes, and MOSFET devices (see e.g. U.S. Pat. No. 7,149,371) configured to simulate diodes. This type of circuit can have a very high impedance for small signals, but also has a certain threshold level above which the impedance will drop.

The characteristic of a diode is that it has a large impedance only if the voltage across it is below, in one direction, the breakdown voltage, and, in the other direction, the forward voltage. In the anti-parallel set-up, the relevant voltage is the forward voltage, as it is the lowest (typically 0.2-0.4V).

A drop in impedance by any of the elements 16 and 22 would be equally detrimental to the operation of the transducer 12.

In FIG. 2, the desired operation of the high impedance elements 16/22 is described as a table and in a graph illustrating signal value (voltage) as a function of the impedance and for three different frequencies: low, intermediate and high. The operation is that at small signal values, i.e. small output voltages, such as 0.2V or lower, of the transducer 12, the impedance is high, such as more than 100 GOhm or higher. Also, a high impedance is desired at high frequencies, such as 50 Hz or higher, and high signal values, such as 0.4V and higher. However, at high signal values and low frequencies, a low impedance is desired.

The advantage of this set-up may be seen at start-up of the system, where the voltages of the system are unknown and where the charge pump 14 is starting up, generating a low frequency high voltage signal to the transducer but then also to the high impedance elements 22. Without special measures, the bias voltage applied to the capacitive transducer takes a long time to settle to the final desired value. This is prevented by the operation illustrated in FIG. 2, where a low impedance acts to accelerate the settling of the bias voltage across the transducer. At usual operation modes, where high signal values may be seen at high frequencies, the high impedance is desired to keep the transducer in the constant charge mode.

In FIG. 3A, an embodiment of a high impedance circuit according to the invention is illustrated for replacing the diodes 22 and/or the diodes 16. Instead of the diodes, two general circuits are provided in series where one (Z(V)) has an impedance defined by the voltage across it whereas the other (Z(f)) has a frequency dependent impedance.

The operation of the circuits is for both directions of the current. Naturally, as is also illustrated further below, individual circuits may be provided for operating in only one direction of the current.

One manner of embodying the system of FIG. 3A is seen in FIG. 3B: a voltage dependent high impedance (anti parallel diode pair) 221 in series with an inductance (the frequency dependent part) 222. In practice it is preferred to use an electronically simulated inductance here, because a suitable inductance would not fit inside the transducer package.

The same functionality, however, may be obtained using (FIG. 3C) a gyrator-C set-up, which is two anti-parallel transconductance amplifiers, one having a positive and the other having a negative transconductance and coupled in series with a capacitor. The first transconductance amplifier converts the input voltage to a current. The voltage on the capacitor is proportional with the time integrated current. The second transconductance amplifier converts that voltage to a current at the input node opposite to the capacitor.

The inductance at the input of the gyrator-C coupling is: $L=C/(G_{m1}*G_{m2})$.

It is noted that the transconductances $G_{m1}$ and $G_{m2}$ need not be the same in the present context.

In FIG. 3D, an embodiment is seen where the operation of the transconductance amplifiers may be obtained by the circuit illustrated. Two sub-circuits are provided, one for each current direction. E.g. one is active when the voltage over the sub-circuit is positive from bottom to top and the other is active when that voltage is negative.

Thus, in general the first and/or second sub-circuits 221/222 may be formed by separate circuits each operating in a separate one of the directions of the current through the circuit, such as from one terminal to another.

The operation of the capacitor is duplicated in each sub-circuit as capacitors 2222 and 2222'.

The transconductance amplifier with transconductance Gm1 has the operation of the two resistors 2223 and 2223' ($R\sim/G_{m1}$), whereas the transconductance amplifier with transconductance $G_{m2}$ has the operation of the two transistors 2221 and 2221' (with the transconductance $G_{m2}$).

In FIG. 3E, the diodes of the diode pair 221 have been divided also, as they also each have their main functions in one direction. Thus, the serial set-up of FIG. 3A may be replaced by a parallel set-up as seen in FIG. 3E where two sub-circuits are provided in parallel. In FIG. 3E, a dashed line is seen between the lower portions of the two diodes. This connection may be removed, as is described in relation to FIG. 4.

It is seen that at high frequencies, the low pass filter (2222 and 2223) is blocking and thus maintains the impedance high even at high signal values, which would "open" the diode. At low frequencies and at low signal strengths, the operation of the diode is the "usual": high impedance, but at high signal strengths and at low frequencies, the low pass filter "conducts" and thus allows the diode to have its usual characteristics at high voltages: low impedance.

Figure 4:
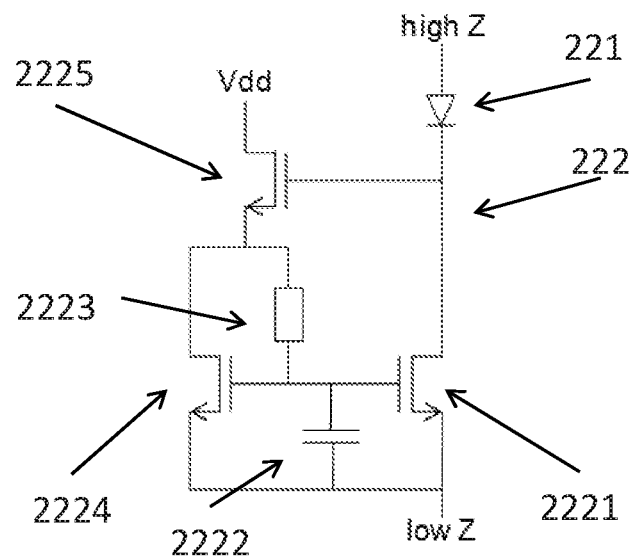
FIG. 4 illustrates a more specific embodiment of a single "direction" of the far right system of FIG. 3.

FIG. 4 illustrates another implementation of the left side of the circuit in FIG. 3E, in which the dashed connection between the two halves of FIG. 3E may be removed. An additional MOSFET 2224 provides a path to discharge capacitor 2222 during the negative phase of the signal. A second MOSFET 2225 is added, which amplifies the current flowing into the filter and which greatly increases the impedance of the frequency dependent part. The operation of MOSFETS 2224 and 2225 can be explained referring to FIG. 3C. Instead of implementing the first transconductance amplifier $G_{m1}$ as resistance 2223, the current flowing into the resistance is now provided by MOSFETS 2224 and 2225, and no longer flows through the diodes 221.

Due to additional current drawn from Vdd, the "low Z" node preferably is able to sink current, and the resulting impedance is asymmetrical. This means that the "low Z" node should be connected to a DC reference voltage, and that the "high Z" node should be connected to the signal carrying node that is to be biased at that DC level without affecting the signal.

Figure 5:
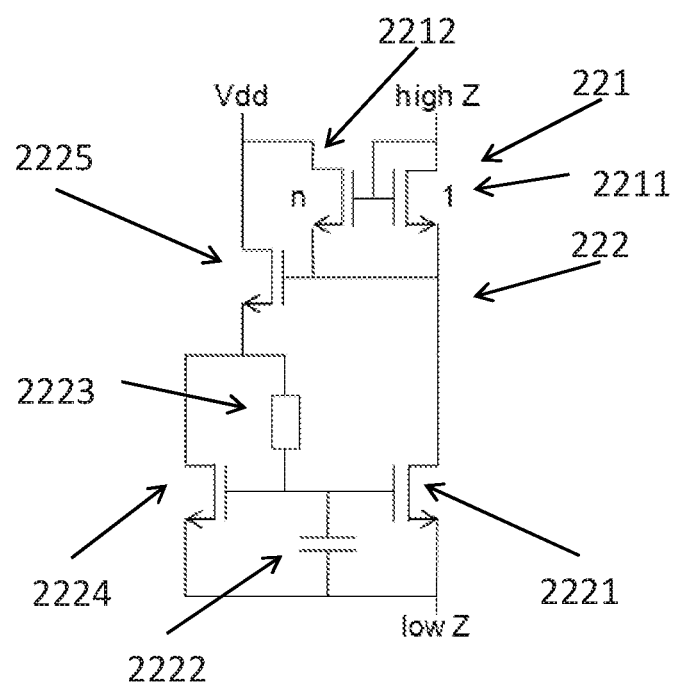
FIG. 5 illustrates another embodiment of the "direction" of FIG. 4.

FIG. 5 illustrates another implementation of the sub-circuit of FIG. 4, where the voltage dependent part 221 is now not embodied as a diode but as a MOSFET 2211 with its gate connected to its source, thus providing a diode-like voltage-current characteristic. The advantage of this approach is that, when using a state-of-the-art CMOS process, the characteristic of anti-parallel diodes can be obtained without one of the cathodes being connected to the substrate. In order to keep the parasitic capacitance on the high impedance node as small as possible, this MOSFET preferably has small dimensions. A second MOSFET 2212 may be added in order to increase the impedance of the sub-circuit even more. MOSFET 2212 may be larger than MOSFET 2211, the increase in impedance on the "high Z" node being increased by the same scaling factor "n".

The embodiments of FIGS. 4 and 5 are able to sink current from the "high Z" node when the voltage on that node is positive relative to the "low Z" node. Referring back to FIG. 3E, FIGS. 4 and 5 only illustrate sub-circuits for use in one "direction".

Figure 6:
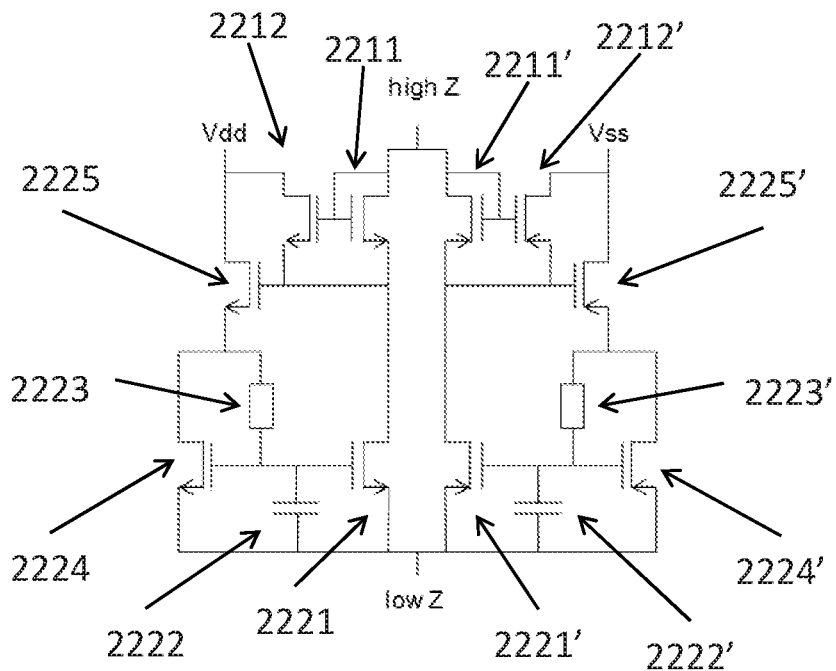
FIG. 6 illustrates the embodiment of FIG. 5 now in both directions.

FIG. 6 illustrates a complete circuit in that it also has a complementary sub-circuit (components 2211', 2212', 2225', 2224', 2223', 2222' and 2221') added in parallel to the high impedance, which is capable of sourcing current to the "high Z" node when the voltage on that node is negative relative to the "low Z" node. The complementary sub-circuit is created by replacing the n-channel MOSFETS by equivalent p-channel MOSFETS, and replacing the positive supply voltage (Vdd) by a negative supply voltage (Vss).

It is seen that the circuit of FIG. 6 is not divided into a serial connection of a voltage dependent sub-circuit and a frequency dependent sub-circuit but rather into two parallel sub-circuits which have the desired properties but only in one of the two directions of the current (voltage between the upper and lower terminals.

It is noted that FIGS. 4-6 do not show the well-connections of the MOSFETs. These wells should all be connected to an appropriate voltage, so that the source-to-well and drain-to-well junctions always stay reversed biased. Dedicated circuitry may be required to actively drive the well voltages so that this condition is fulfilled.

Figure 7:
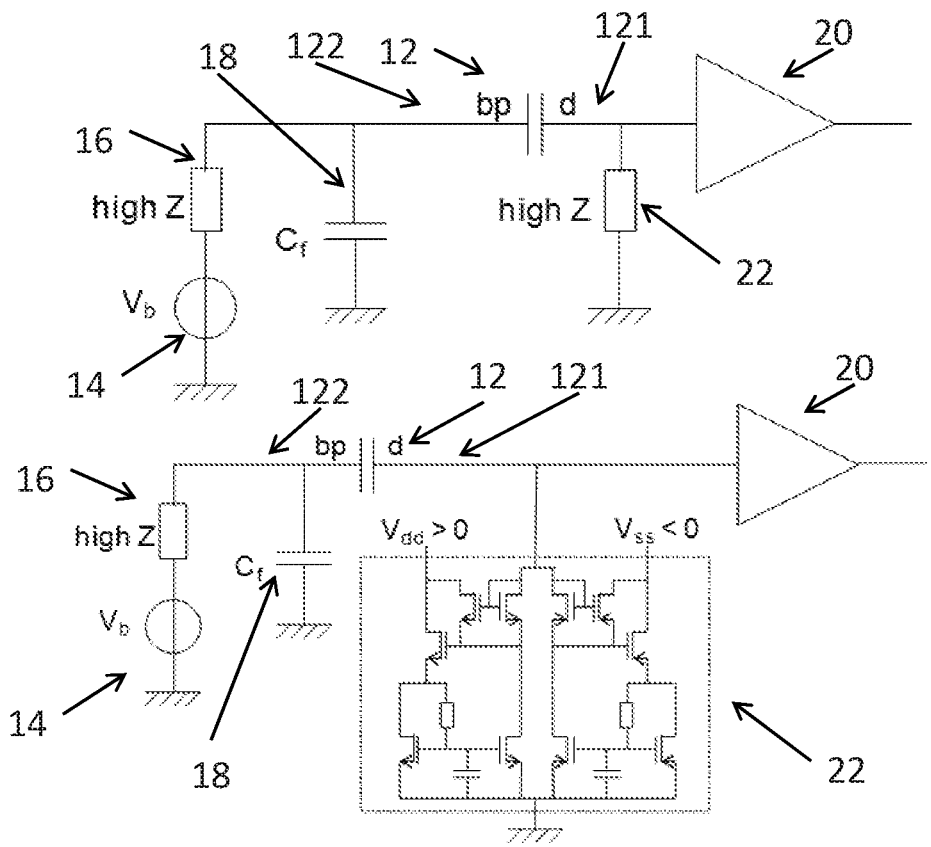
FIG. 7 illustrates a back plate biased system in a general illustration and using the system of FIG. 6.

FIG. 7 illustrates, in the upper part, a general system with a back plate biased transducer 12 having terminals 121 and 122 and a diaphragm outputting, via the terminal 121, the signal to the amplifier 20 and where two high impedance elements 16 and 22 are provided. In this embodiment, the output of the transducer terminal 121 is fed directly to the amplifier input. Alternatively, the back plate could output the signal to the amplifier.

In this situation, the high impedance element 16 connecting the charge pump 14 to the terminal 122 and the backplate bp (and filter capacitor 18) has constant voltages on both nodes, and need not be replaced.

Conversely, it is desired to implement the high impedance element 22 as e.g. that seen in FIG. 6. This is illustrated in the lower part of FIG. 7.

It is noted that the two supply connections (Vdd and Vss) of the high impedance circuit 22 should be connected to voltages higher than the maximum voltage and lower than the lowest voltage occurring on the amplifier input. In the present situation, as the high impedance system is connected to ground the quiescent voltage on the amplifier is 0 V. In general, Vdd and Vss should be on either side of the voltage to which the lower terminal of the element 22 is connected.

Figure 8:
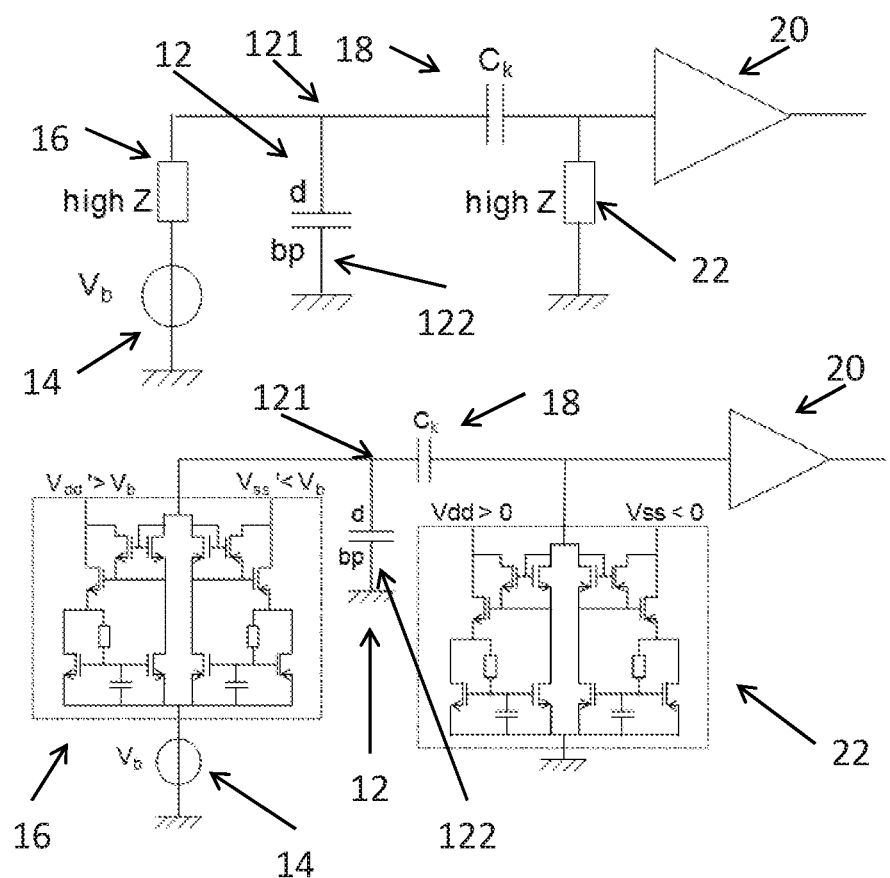
FIG. 8 illustrates a diaphragm biased system in a general illustration and using the system of FIG. 6.

FIG. 8 illustrates, in the upper part, a general system with a diaphragm biased transducer 12 having terminals 121 and 122 and with a diaphragm d outputting, via the terminal 121, the signal to the amplifier 20 and where two high impedance elements 16 and 22 are provided. A capacitor 18, Ck prevents DC coupling to the amplifier while passing all frequencies which may be output by the transducer to the amplifier input.

In this situation, both high impedance nodes carry the same signal, whereby it is desired to also implement the high impedance component 16 as that of e.g. FIG. 6. This is illustrated in the lower part of FIG. 8.

In this respect, it is, again, desired that the supply voltages to the high impedance element 22 is above and below, respectively, maximum and minimum voltage on the transducer connection.

As to the high impedance element 16, it is preferred that this is supplied with voltages above and below, respectively, the biasing voltage of the charge pump 14.

This latter supplying of multiple voltages to the high impedance circuits and especially voltages higher than the biasing voltage may be avoided.

In addition to this, clearly the operation of the two high impedance elements is desired to be the same.

Figure 9:
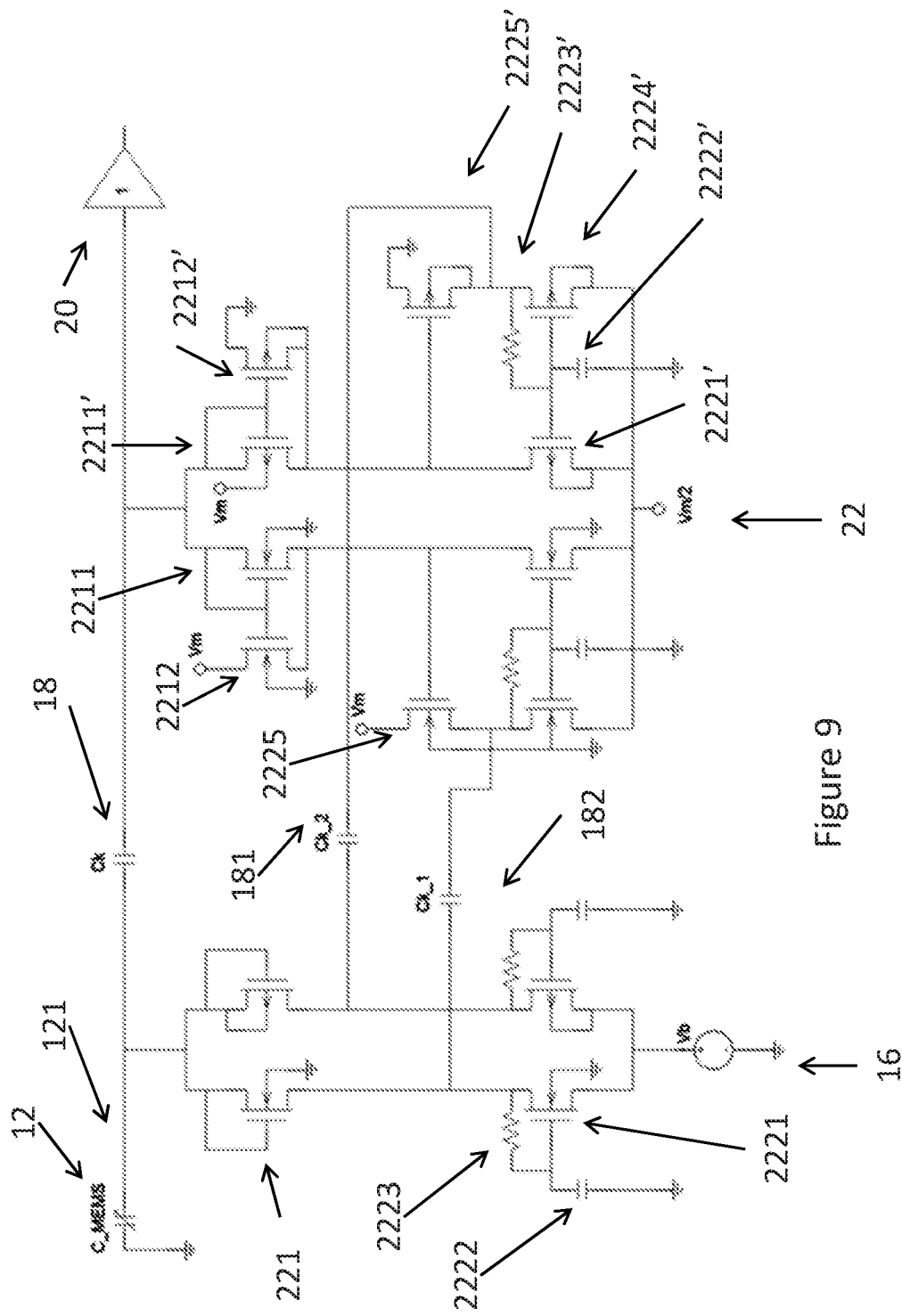
FIG. 9 illustrates an alternative embodiment where two high impedance networks co-operate and
  FIG. 10 illustrates an alternative to the embodiment of FIG. 9.

In FIG. 9, an embodiment is seen illustrating a part of a system, namely the transducer 12, the high impedance circuit 16, the capacitor 18, the high impedance circuit 22 and the amplifier 20. Comparing to FIGS. 7 and 8, a number of elements are left out, such as the charge pump, to simplify the drawing.

It is seen that the high impedance element 16 has a structure corresponding to that of FIG. 3D, where the diodes are replaced by transistors having the same functionality.

The high impedance element 22 on the other hand corresponds to that of FIG. 6.

Only some of the components in these circuits have been provided with reference signs in order to provide a clear illustration.

It is seen that the impedance element 22 is connected, via two DC decoupling capacitors 181 and 182, to the element 16, whereby the element 16 does not need a power supply of its own.

Also, it is seen that the operation of the transistors (see FIG. 6) 2225 and 2225' is transferred, via the capacitors 181 and 182 to the element 16

The element 16 acts as a slave element to the element 22 controlling the element 16, as both elements receive the same signal on its respective side of the capacitor 18.

In this manner, the high impedance element 16 does not need its own power supply, and only a single power supply is required for the two circuits. This power supply supplies voltages relating to the output of the transducer and not the biasing thereof.

Figure 10:
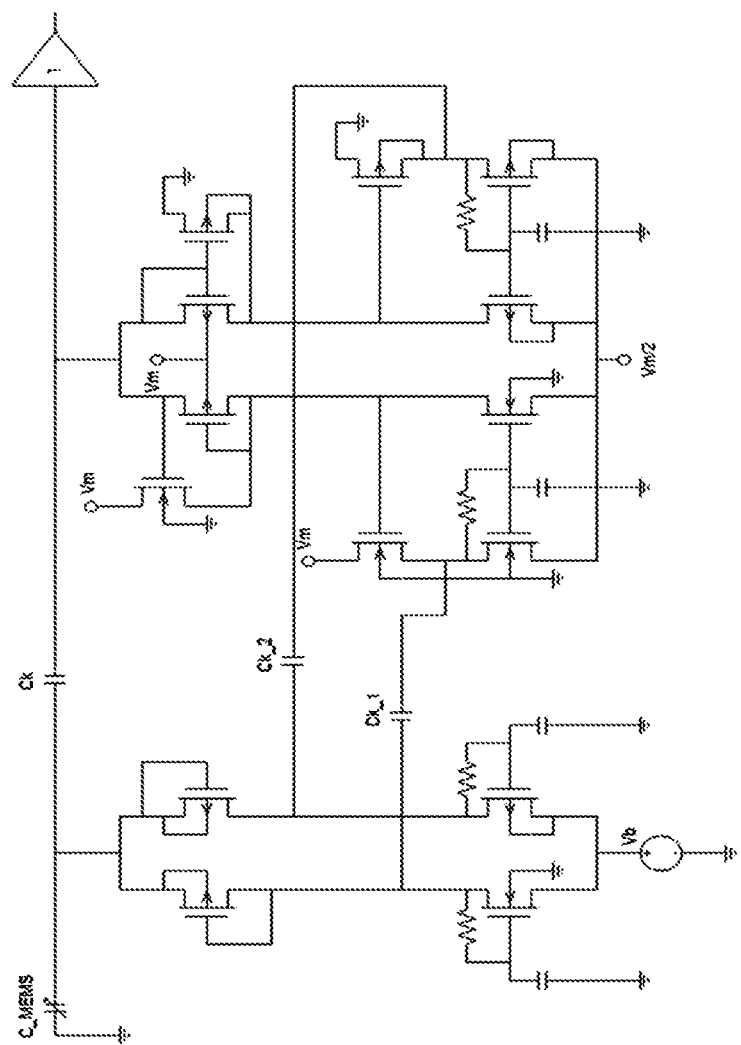

In FIG. 10, an alternative is illustrated, the main difference being the choice of another type of transistor.

The invention claimed is:

1. A system comprising:
   a transducer with an output,
   an amplifier with an input,
   a transport element for receiving a signal from the transducer output and feeding a corresponding signal to the amplifier input and
   a circuit having a first and a second terminal and an impedance, between the first and second terminals which:
   exceeds 100 GOhm when an absolute voltage below 0.2V is provided over the first and second terminals,
   exceeds 100 GOhm when a signal with a frequency exceeding 50 Hz is provided over the first and second terminals and
   is lower than 10 GOhm when a signal with an absolute voltage exceeding 0.4V and a frequency lower than 10 Hz is provided over the first and second terminals,
   wherein the first terminal is connected to the transport element and the second terminal is connected to a predetermined voltage.

2. A system according to claim 1, further comprising a first voltage supply configured to output a first voltage, and wherein the transducer comprises:
   one or more stationary elements,
   a movable element movable in relation to the stationary element(s) and
   a voltage input configured to receive the first voltage and provide the first voltage between two of the movable element and the stationary element(s)
   the system further comprising an additional circuit having a first and a second terminal and an impedance, between the first and second terminals which:
   exceeds 100 GOhm when an absolute voltage below 0.2V is provided over the first and second terminals,
   exceeds 100 GOhm when a signal with a frequency exceeding 50 Hz is provided over the first and second terminals and
   is lower than 10 GOhm when a signal with an absolute voltage exceeding 0.4V and a frequency lower than 10 Hz is provided over the first and second terminals,
   the additional circuit having its first terminal connected to the voltage input and the second terminal to a second, predetermined voltage.

3. A system according to claim 1, wherein the circuit is formed by a first sub-circuit and a second sub-circuit connected in series between the first and second terminals, where:
   the first sub-circuit has an impedance:
   exceeding 100 GOhm when a signal with an absolute voltage exceeding 0.4V is provided over the first and second terminal,
   lower than 10 GOhm when a signal with an absolute voltage lower than 0.2V is provided over the first and second terminal,
   the second sub-circuit has an impedance:
   exceeding 100 GOhm when a signal with a frequency exceeding 50 Hz is provided over the first and second terminal,
   lower than 10 GOhm when a signal with a frequency lower than 10 Hz is provided over the first and second terminal.

4. A system according to claim 3, wherein the first sub-circuit comprises a diode.

5. A system according to claim 3, wherein the second sub-circuit comprises:
   a third terminal and a fourth terminal,
   a first transistor having a base, a collector and an emitter and having its base connected to the third terminal and its collector connected to a predetermined voltage,
   a second transistor having a base, a collector and an emitter and having its collector connected to the third terminal and its emitter connected to the fourth terminal,
   a resistor connected between the emitter of the first transistor and the base of the second transistor,
   a third transistor having a base, a collector and an emitter and having its base connected to the base of the second transistor, its collector connected to the emitter of the first transistor and its emitter connected to the fourth terminal, and
   a capacitor connected between the base of the second transistor and the fourth terminal.

6. A system according to claim 3, wherein the second sub-circuit comprises:
   a third terminal and a fourth terminal,
   a first transistor having a gate, a source and a drain and having its gate connected to the third terminal and its drain connected to a predetermined voltage,
   a second transistor having a gate, a source and a drain and having its drain connected to the third terminal and its source connected to the fourth terminal,
   a resistor connected between the source of the first transistor and the gate of the second transistor,
   a third transistor having a gate, a source and a drain and having its gate connected to the gate of the second transistor, the drain to the source of the first transistor and its source connected to the fourth terminal, and
   a capacitor connected between the gate of the second transistor and the fourth terminal.

7. A system according to claim 5, the second sub-circuit further comprises, connected between the third and fourth terminals:
   another first transistor having a base, a collector and an emitter and having its base connected to the third terminal and its collector connected to another predetermined voltage,
   another second transistor having a base, a collector and an emitter and having its collector connected to the third terminal and its emitter connected to the fourth terminal,
   another resistor connected between the emitter of the other first transistor and the base of the other second transistor,
   another third transistor having a base, a collector and an emitter and having its base connected to the base of the other second transistor, its collector connected to the emitter of the other first transistor and its emitter connected to the fourth terminal, and
   another capacitor connected between the base of the other second transistor and the fourth terminal
   where the first, second and third transistors are one of n-type and p-type transistors and wherein the other first, second and third transistors are the other of the n-type and p-type transistors.

8. A system according to claim 5, the second sub-circuit further comprising, connected between the third and fourth terminals:
   another first transistor having a gate, a source and a drain and having its gate connected to the third terminal and its drain connected to another predetermined voltage, another second transistor having a gate, a source and a drain and having its drain connected to the third terminal and its source connected to the fourth terminal, another resistor connected between the source of the other first transistor and the gate of the other second transistor, another third transistor having a gate, a source and a drain and having its gate connected to the gate of the other second transistor, the drain to the source of the other first transistor and its source connected to the fourth terminal, and another capacitor connected between the gate of the other second transistor and the fourth terminal, where the first, second and third transistors are one of n-type and p-type transistors and wherein the other first, second and third transistors are the other of the n-type and p-type transistors.

9. A system according to claim 1, the circuit comprising a third and a fourth sub-circuits connected in parallel between the first and second terminals, were the third sub-circuit has an impedance which:

exceeds 100 GOhm when an positive voltage below 0.2V is provided to the first terminal compared to the second terminal, exceeds 100 GOhm when a signal with a frequency exceeding 50 Hz is provided over the first and second terminals, exceeds 100 GOhm when a signal with a frequency lower than 10 Hz is provided over the terminals, the signal having a negative voltage exceeding 0.4V provided to the first terminal compared to the second terminal and is lower than 10 GOhm when a signal with a frequency lower than 10 Hz is provided over the terminals, the signal having a positive voltage exceeding 0.4V provided to the first terminal compared to the second terminal and where the fourth sub-circuit has an impedance which:

exceeds 100 GOhm when a negative voltage below 0.2V is provided to the first terminal compared to the second terminal, exceeds 100 GOhm when a signal with a frequency exceeding 50 Hz is provided over the first and second terminals, exceeds 100 GOhm when a signal with a frequency lower than 10 Hz is provided over the terminals, the signal having a positive voltage exceeding 0.4V provided to the first terminal compared to the second terminal and is lower than 10 GOhm when a signal with a frequency lower than 10 Hz is provided over the terminals, the signal having a negative voltage exceeding 0.4V provided to the first terminal compared to the second terminal.

10. A system according to claim 9, wherein one of the third and fourth sub-circuits comprises:

a third terminal and a fourth terminal, a first transistor having a base, a collector and an emitter and having its base connected to the third terminal and its collector connected to a predetermined voltage, a second transistor having a base, a collector and an emitter and having its collector connected to the third terminal and its emitter connected to the fourth terminal, a resistor connected between the emitter of the first transistor and the base of the second transistor, a third transistor having a base, a collector and an emitter and having its base connected to the base of the second transistor, its collector connected to the emitter of the first transistor and its emitter connected to the fourth terminal, and a capacitor connected between the base of the second transistor and the fourth terminal.

11. A system according to claim 9, wherein one of the third and fourth sub-circuits comprises:

a third terminal and a fourth terminal, a first transistor having a gate, a source and a drain and having its gate connected to the third terminal and its drain connected to a predetermined voltage, a second transistor having a gate, a source and a drain and having its drain connected to the third terminal and its source connected to the fourth terminal, a resistor connected between the source of the first transistor and the gate of the second transistor, a third transistor having a gate, a source and a drain and having its gate connected to the gate of the second transistor, the drain to the source of the first transistor and its source connected to the fourth terminal, and a capacitor connected between the gate of the second transistor and the fourth terminal.

12. A system according to claim 10, wherein the other of the third and fourth sub-circuits further comprises, connected between the third and fourth terminals:

another first transistor having a base, a collector and an emitter and having its base connected to the third terminal and its collector connected to another predetermined voltage, another second transistor having a base, a collector and an emitter and having its collector connected to the third terminal and its emitter connected to the fourth terminal, another resistor connected between the emitter of the other first transistor and the base of the other second transistor, another third transistor having a base, a collector and an emitter and having its base connected to the base of the other second transistor, its collector connected to the emitter of the other first transistor and its emitter connected to the fourth terminal, and another capacitor connected between the base of the other second transistor and the fourth terminal where the first, second and third transistors are one of n-type and p-type transistors and wherein the other first, second and third transistors are the other of the n-type and p-type transistors.

a third transistor having a gate, a source and a drain and having its gate connected to the gate of the second transistor, the drain to the source of the first transistor and its source connected to the fourth terminal, and a capacitor connected between the gate of the second transistor and the fourth terminal.

13. A system according to claim 10, wherein the other of the third and fourth sub-circuits comprises, connected between the third and fourth terminals:

another first transistor having a gate, a source and a drain and having its gate connected to the third terminal and its drain connected to another predetermined voltage, another second transistor having a gate, a source and a drain and having its drain connected to the third terminal and its source connected to the fourth terminal, another resistor connected between the source of the other first transistor and the gate of the other second transistor, another third transistor having a gate, a source and a drain and having its gate connected to the gate of the other second transistor, the drain to the source of the other first transistor and its source connected to the fourth terminal, and another capacitor connected between the gate of the other second transistor and the fourth terminal, where the first, second and third transistors are one of n-type and p-type transistors and wherein the other first, second and third transistors are the other of the n-type and p-type transistors.

14. A system comprising:

a first voltage supply configured to output a first voltage, a transducer comprising:

one or more stationary elements, a movable element movable in relation to the stationary element(s), a voltage input configured to receive the first voltage and provide the first voltage between two of the movable element and the stationary element(s), and a transducer output, an amplifier with an input, a transport element for receiving a signal from the transducer output and feeding a corresponding signal to the amplifier input and a circuit having a first and a second terminal and an impedance, between the first and second terminals which:

exceeds 100 GOhm when an absolute voltage below 0.2V is provided over the first and second terminals, exceeds 100 GOhm when a signal with a frequency exceeding 50 Hz is provided over the first and second terminals and is lower than 10 GOhm when a signal with an absolute voltage exceeding 0.4V and a frequency lower than 10 Hz is provided over the first and second terminals, wherein the first terminal is connected to the voltage input and the second terminal to a predetermined voltage.

15. A system according to claim 14, further comprising a second circuit having a first and a second terminal and an impedance, between the first and second terminals which:

exceeds 100 GOhm when an absolute voltage below 0.2V is provided over the first and second terminals, exceeds 100 GOhm when a signal with a frequency exceeding 50 Hz is provided over the first and second terminals and is lower than 10 GOhm when a signal with an absolute voltage exceeding 0.4V and a frequency lower than 10 Hz is provided over the first and second terminals, the second circuit having the first terminal connected to the transport element and the second terminal to a predetermined voltage.

\* \* \* \* \*